United States Patent [19]
Tsai

[11] Patent Number: 6,028,319
[45] Date of Patent: Feb. 22, 2000

[54] CALIBRATION STANDARD FOR LEAD CONFIGURATIONS AND METHOD OF USING

[75] Inventor: Yun T. Tsai, Keelung, Taiwan

[73] Assignee: Taiwan Semiconductor Manufacturing Company, Ltd., Hsin-Chu, Taiwan

[21] Appl. No.: 09/003,319

[22] Filed: Jan. 6, 1998

[51] Int. Cl.[7] ............................. G01R 35/00; G01J 1/02
[52] U.S. Cl. ................. 250/559.34; 382/146; 356/243.1
[58] Field of Search ................. 250/559.34, 559.29; 356/394, 237.5, 243.1; 382/146, 151, 145; 348/126

[56] References Cited

U.S. PATENT DOCUMENTS 5,489,843  2/1996  Erjavic et al. ..................... 324/158.1
5,563,703  10/1996 Lebeau et al. ..................... 356/237.5
5,838,434  11/1998 Skramsted et al. ................. 356/243.1

*Primary Examiner*—Edward P. Westin
*Assistant Examiner*—Thanh X. Luu
*Attorney, Agent, or Firm*—Tung & Associates

[57] ABSTRACT

The present invention discloses a calibration standard for use in a CCD or laser lead scanner for the measurement of lead configurations in an IC package by selectively making three leads with one on three of the four sides of the package at least 0.03 mm longer than the remaining leads such that a consistent calibration plane, i.e., seating plane, is obtained by the lead scanner such that the scanner can be calibrated for making accurate measurements. The utilization of the present invention calibration standard greatly improves the accuracy of measurements made by a CCD or laser lead scanner such that a repair and rework rate of up to 30% that is normally achieved by a conventional standard can be drastically reduced.

20 Claims, 1 Drawing Sheet

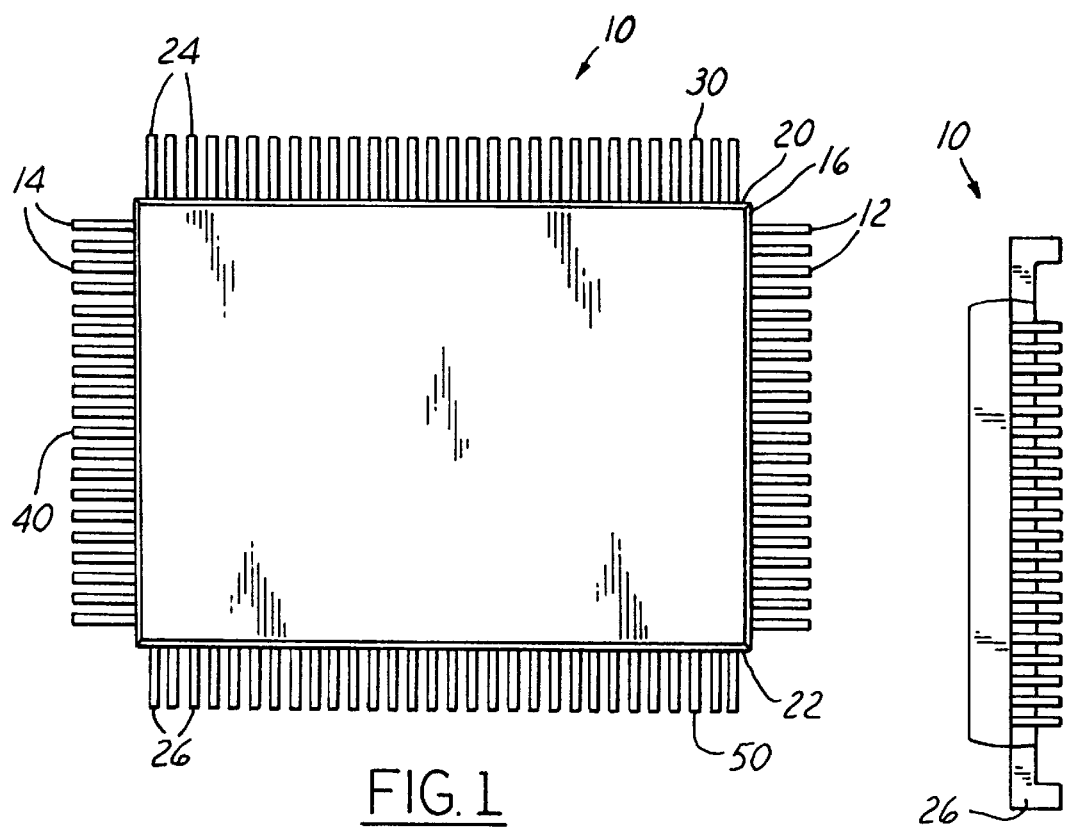
FIG. 1
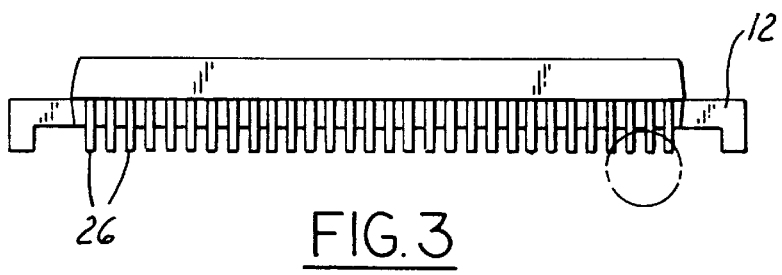
FIG. 2
FIG. 3
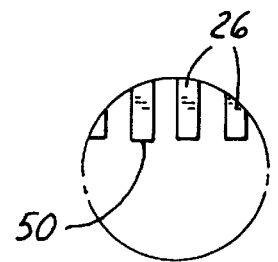
FIG. 3A

CALIBRATION STANDARD FOR LEAD CONFIGURATIONS AND METHOD OF USING

FIELD OF THE INVENTION

The present invention generally relates to a calibration standard for lead configurations for use in a lead scanner and a method for using the standard and more particularly, relates to a calibration standard for lead configurations for use in a CCD or laser lead scanner by providing three leads with one from three of the four sides of an IC package that are at least 0.03 mm longer than the other leads such that a consistent calibration plane (or seating plane) based on the three longer leads can be measured and used for calibrating the lead scanner, and a method for using such calibration standard.

BACKGROUND OF THE INVENTION

In the fabrication technologies for semiconductor devices, the packaging of a semiconductor chip is an important step of the total process. The purposes for packaging are several folds, i.e., to provide electrical connection to the chip, to expand the chip electrode pitch for the next level packaging, to protect the chip from mechanical and environmental stresses, and to provide a thermal path for dissipating the heat generated in the chip. The packaging step in the semiconductor manufacturing process affects the overall cost, performance, and reliability of the packaged chip and the system in which the package is used. The performance of a semiconductor device can also be aided by improvements made in the packaging technology. Modern VLSI and ULSI devices require superior packaging performance. A high density ULSI package that contains a relatively large chip requires a smaller external terminal spacing and therefore, further complicates the packaging requirements.

Plastic packages have become more popular as their applications expand into chips that were packaged by hermetically sealed ceramic packages. A plastic package can be produced in a typically automated batch handling process and therefore, can be made very cost competitive. The development in plastic packages has also been aided by the recent improvements in plastic materials, in processing equipment and specific design features that are built into the plastic packages.

In a typical plastic package, a semiconductor chip is attached to the paddle of a lead frame. The lead frame which is made of etched or stamped thin sheet metal serves as a skeleton around which the package can be assembled. The lead frame also provides the external leads in a completed encapsulated package while interconnections are made with fine gold wires. The encapsulation of a plastic package can be carried out in a transfer molding process by using a suitable plastic resin. One of such suitable plastic resin is epoxy or polyimide. The plastic resin covers the chip during the molding process and forms the package's outer dimensions at the same time. The external leads from the lead frame are then formed into a desired shape after the molding process. The benefit of a plastic package is that the plastic thoroughly insulates the chip from its surrounding environment and therefore protects the chip from mechanical and chemical factors outside the chip.

A popularly used plastic package is a plastic quad flat package (PQFP) in which a large number of external leads extend from all four sides of the plastic package after the molding process. It can be economically molded in an automated plastic injection molding process while allowing a maximum number of external leads to be connected to the chip. Variations of the quad flat package have been developed in recent years which include the thin quad flat package (TQFP) and the quad flat J-lead package (QFJ). One of the key requirements in packaging semiconductor chips in a PQFP is the lead integrity, i.e., the co-planarity and skew of the leads. In order to meet a stringent quality control and reliability requirement when a PQFP is assembled to a PC board, the lead configurations on a PQFP must be strictly controlled.

In the quality control and reliability testing of plastic packages equipped with external leads, i.e., such as PQFP's, an optical lead scanner that operates on a CCD (charged couple diode) or laser beam principle is frequently used. The CCD or laser lead scanner has the capability of scanning each of the external leads on a plastic package determining the co-planarity and skewness of each lead. When the measurements on co-planarity and skewness exceed a certain critical value, the packaged IC or the PQFP is rejected. A rejected plastic package can be sent back to its packaging plant where the package can be reworked. In a reworking process, the external leads are first straightened and then reformed into desired configurations according to the specification. Normally, the external leads on a plastic package can be reworked two times before the leads become fragile and susceptible to breakage such that they can no longer be reformed.

In a conventional method for operating a CCD or laser lead scanner, the scanner must first be calibrated by a standard package supplied by the scanner manufacturer to assure its accuracy. A calibration tool is thus required for performing the calibration process. The lead scanner manufacturer frequently supplies a standard package and a software program for use in conjunction with the package for the calibration of the scanner. However, such calibration tool does not always provide the extreme accuracy demanded in modern IC packages. For instance, some of the parameters measured by a lead scanner are in a three dimensional space while the software program supplied can only make planar or two-dimensional corrections. Moreover, the calibration standard supplied by the scanner manufacturer may not provide any resemblance to the actual plastic package measured. For instance, the configuration of a standard calibration sample supplied by the scanner manufacturer, i.e., a 10-pin package can be completely different than the configuration of a PQFP which has 100 pins. These deficiencies greatly reduce the accuracy of the lead scanner when used to measure a high pin-count PQFP.

It is therefore an object of the present invention to provide a calibration standard for use in a lead scanner that does not have the drawbacks and the shortcomings of the conventional calibration standards.

It is another object of the present invention to provide a calibration standard for use in a lead scanner for measuring lead configurations in an IC package that is capable of producing a consistent calibration of the lead scanner.

It is a further object of the present invention to provide a calibration standard for use in an CCD or laser lead scanner for measuring lead configurations in a plastic molded IC package by specially designing three leads on the standard that are longer than the other leads such that a consistent calibration plane can be measured each time the standard is used to calibrate the scanner.

It is another further object of the present invention to provide a calibration standard for use in a CCD or laser lead scanner for measuring lead configurations in an IC package that utilizes three longer leads in the package with one on three of the four sides of the package such that a consistent seating plane can be measured each time by using the standard.

It is yet another object of the present invention to provide a calibration standard for a CCD or laser lead scanner for measuring lead configurations on a PQFP by ensuring that the same three pins on the standard are used for creating a seating plane to improve the consistency and accuracy of the scanner.

It is still another object of the present invention to provide a calibration standard for use in a CCD or laser lead scanner for measuring lead configurations in a PQFP by first providing a consistent seating plane such that readings from the scanner can be calibrated based on such seating plane.

It is yet another further object of the present invention to provide a method for calibrating a lead scanner for measuring lead configurations in an IC package by first providing a calibration standard such that a consistent seating plane can be measured by the scanner for calibrating the scanner and then measuring the deviations of each external leads on the package from such seating plane.

It is still another further object of the present invention to provide a method for calibrating a lead scanner for measuring lead configurations on an IC package by first providing a calibration standard with which the same seating plane can be determined by three specifically designed leads in the package which has a length that is at least 0.03 mm longer than the remaining multiplicity of leads.

SUMMARY OF THE INVENTION

The present invention discloses a calibration standard for use in a CCD or laser lead scanner for measuring lead configurations in an IC package by providing three longer leads in the package each on three of the four sides such that a consistent calibration plane, or seating plane, can be determined for calibrating the lead scanner before it is used to determine the lead configurations of the external leads on an IC package.

In a preferred embodiment, a calibration standard for a lead scanner for measuring lead configurations in an IC package is provided which includes a molded body and a multiplicity of external leads extending outwardly from the body, wherein the molded body has a rectangular or square shape defined by a top surface, a bottom surface and four sides joining the top and bottom surfaces, the multiplicity of leads emanating from the four sides of the molded body wherein one lead from three of the four sides is at least 0.03 mm longer than the other multiplicity of leads such that a consistent calibration plane based on the same three leads can be measured by and used for calibrating the lead scanner.

The present invention is also directed to a method for calibrating a lead scanner for measuring lead configurations in an IC package such as a PQFP by the operating steps of first providing a calibration standard which has a multiplicity of external leads extending outwardly from the standard, wherein one lead each from three sides of the standard is longer by at least 0.03 mm than the remaining multiplicity of leads, then measuring a seating plane on the three longer leads and obtaining a first set of data, then comparing the first set of data on the lead scanner with an international measurement standard, then adjusting the lead scanner and obtaining a second set of data on the seating plane, and then repeating the adjusting step and the measuring step until a final set of data which is substantially equal to the international measurement standard is obtained.

BRIEF DESCRIPTION OF THE DRAWINGS

These and other objects, features and advantages of the present invention will become apparent from the following detailed description and the appended drawings in which:

FIG. 1 is a plane view of a present invention calibration standard for a plastic quad flat package that has 100 external leads.

FIG. 2 is a side view of the plastic quad flat pack shown in FIG. 1 illustrating the thicker than usual leads.

FIG. 3 is a side view 90° to that shown in FIG. 2 of the present invention calibration standard.

FIG. 3A is a partial, enlarged view of area A in FIG. 3.

DETAILED DESCRIPTION OF THE PREFERRED EMBODIMENT

The present invention discloses a calibration standard for use in a lead scanner for measuring lead configurations in a semiconductor package. The standard has a novel construction of three longer leads with one on three of the four sides of the package such that a consistent calibration plane, or seating plane, can be measured for calibrating the scanner by comparing to an international measurement standard. The present invention is also directed to a method for calibrating a lead scanner that is used for measuring lead configurations on a semiconductor package by utilizing a calibration standard that is capable of providing a consistent seating plane each time when measured by the scanner and then adjusting the scanner until a set of data obtained on the seating plane is substantially the same as the international measurement standard. The lead scanner can then be used for measuring lead configurations on the semiconductor package by measuring the vertical distance of each lead from the seating plane.

Referring initially to FIG. 1. where it is shown an enlarged, plane view of a present invention calibration standard 10. The calibration standard 10 is fabricated to the exact dimensions of a production plastic quad flat package except that the leads are made thicker. As shown in FIG. 1, the PQFP package is equipped with twenty external leads 12, 14 on the two horizontal sides 16 and 18 of the package 10. On the two vertical sides 20 and 22 of the PQFP package 10, thirty leads 24, 26 are provided. The total number of external leads available in PQFP package 10 is thus 100. The external leads 12, 14, 24 and 26 extend from the PQFP package 10 are configured of the same configuration on a production PQFP package that has 100 external leads. This provides the benefit that the calibration standard 10 can be used to closely simulate the lead configurations on a production part such that more accurate measurements can be made. The leads 12, 14, 24 and 26 are fabricated of SKD-11 carbon steel such that they are more rigid than those found on a production PQFP package, and as a result, the standard 10 can be used repeatedly for calibrating a lead scanner without deformation.

The thickness of the leads, as shown in FIGS. 2 and 3, are larger than that found on a production PQFP package. For instance, the height of the bent portion of the lead 26 as indicated by X is approximately 0.8 mm, as shown in FIG. 2. The thickness of the lead 12, shown in FIG. 3 by Y, is also approximately 0.8 mm. In a production PQFP package, the external leads on the package have a thickness of approximately 0.3 mm. The present invention calibration standard therefore utilizes external leads that on average has a thickness of more than twice of that found on a production PQFP. This novel feature of the present invention calibration standard enables the standard to be used repeatedly without deformation or damages occurring to the external leads. The width of the leads 26, shown in FIG. 3 as Z, is approximately 0.3 mm which is similar to that in a production PQFP.

The operation of a CCD lead scanner for measuring lead configurations can be briefly described as follows. In the CCD lead scanner, a light source is used to illuminate the leads from an upper/side position such that shadows of the leads are projected on a bottom surface on which the calibration stand is positioned juxtaposed to. The lead scanner then measures the length of a lead by gradually approaching the lead from a bright lite portion to a dark shadow of the lead. As soon as the edge of the dark shadow is reached and read by the scanner, the coordinate measured is determined as the length of the lead. The present invention novel calibration standard and the novel method of using such standard can therefore be used in any lead scanners that utilizes the optical principle. In a laser head lead scanner, a light source is not required. Instead, a laser or laser beam is directly projected onto a package such that the intensity of a reflected beam can be measured to determine the length of the lead.

As an example of the CCD method, one lead from three of the four sides of the calibration standard 10 is first selected. This is shown in FIG. 1, as leads 30, 40 and 50. Each of the three leads are made longer than the remaining multiplicity of leads. The extra length is at least 0.03 mm, and preferably at least 0.05 mm. The three longer leads 30, 40 and 50 are measured by the scanner and used to determine a calibration plane, or a seating plane, of the standard. In a lead scanner, the co-planarity value of the three leads 30, 40 and 50 measured should be 0. The fact that the calibration standard 10 is made exactly to the same dimensional size of a production PQFP enables a high accuracy to be obtained from the lead scanner. The lead configurations of the calibration standard 10 expressed in various parameters such as the co-planarity, the pitch of the lead are measured for each lead by a certified laboratory, and can be traced to an international measurement standard such as NIST.

FIG. 3A is an enlarged, partial view of the circle A shown in FIG. 3. It is seen that the longer lead 50 has a length that is 0.05 mm longer than the neighboring regular leads 26.

In practicing the present invention, the novel calibration standard 10 is first positioned in a lead scanner for making measurements and determining a calibration plane, or a seating plane, based on the three longer leads 30, 40 and 50. Since only these three leads are longer than the remaining multiplicity of leads, the same three leads of 30, 40 and 50 will be chosen by the lead scanner for the determination of the reference seating plane each time it is placed in the lead scanner. The present invention novel method, therefore, enables the same reference seating plane to be measured for the calibration standard and thus be reliably used for calibration.

The present invention novel calibration standard eliminates the inaccuracy that is normally associated with the conventional calibration standard and the conventional calibration method provided by the scanner manufacturer. The measurements made on the calibration plane, or the seating plane, by the lead scanner is then compared to a standard value provided by the certification laboratory. The accuracy of the lead scanner can then be determined and the scanner be calibrated when it appears to be out of specification. The present invention four-sided-100-lead calibration standard 10 can therefore be used to obtain measurements to fully calibrate the accuracy of the lead scanner.

A highly accurate measurement of the co-planarity of a PQFP package by a profile projector, or a lead scanner, is thus possible by using the present invention novel method. Furthermore, the calibration standard 10 is constructed of a fatigueless alloy of SKD-11, and is fully calibrated by certified laboratory of its dimensions, which includes co-planarity, pitch, width, and length. The data can be accurately measured and then traced to an international measurement standard such as NIST. The leads 12, 14, 24 and 26 of the present invention calibration standard 10 are formed in a bent shape, i.e., bent downwardly as viewed in the top view of FIG. 1, and are made of a larger thickness metal than a production PQFP package to further improve the durability and reliability of the calibration standard. The larger thickness of the leads on the calibration standard does not affect the measurement made on a lead scanner, since only images projected on the lead scanner CCD camera is measured. The images are not affected by the thickness of the external leads.

The present invention novel calibration standard and a method of utilizing such standard have been amply demonstrated by the above descriptions and the appended drawings of FIGS. 1–3A. By utilizing the present invention novel calibration standard, the same reference seating plane is always measured to insure the accuracy of the calibration process.

While the present invention has been described in an illustrative manner, it should be understood that the terminology used is intended to be in a nature of words of description rather than of limitation.

Furthermore, while the present invention has been described in terms of a preferred embodiment. it is to be appreciated that those skilled in the art will readily apply these teachings to other possible variations of the invention.

The embodiment of the invention in which an exclusive property or privilege is claimed are defined as follows:

1. A calibration standard for a lead scanner for measuring lead configurations in an IC package comprising:
   a body and a multiplicity of leads extending outwardly from said body,
   said body having a rectangular shape defined by a top surface, a bottom surface and four sides joining said top and bottom surfaces,
   said multiplicity of leads emanating from said four sides of the body wherein one lead each from three of said four sides being at least 0.01 mm longer than the other multiplicity of leads such that a consistent calibration plane based on the same three longer leads is measured by and used for calibrating said lead scanner.

2. A calibration standard for a lead scanner according to claim 1, wherein said calibration plane measured is based on the same three leads each time.

3. A calibration standard for a lead scanner according to claim 1, wherein said one lead each from three of said four sides is preferably at least 0.03 mm longer than the remaining multiplicity of leads.

4. A calibration standard for a lead scanner according to claim 1, wherein said one lead each from three of said four sides is preferably at least 0.05 mm longer than the remaining multiplicity of leads.

5. A calibration standard for a lead scanner according to claim 1, wherein said multiplicity of leads are made of a thickness larger than the thickness of leads on a production IC package.

6. A calibration standard for a lead scanner according to claim 1 wherein said multiplicity of leads are made with a thickness of not less than 0.5 mm.

7. A calibration standard for a lead scanner according to claim 1, wherein said multiplicity of leads are preferably made with a thickness of not less than 0.8 mm.

8. A calibration standard for a lead scanner according to claim 1, wherein said IC package is a plastic quad flat package.

9. A calibration standard for a lead scanner according to claim 1, wherein said IC package is a plastic package.

10. A calibration standard for a lead scanner according to claim 1, wherein said calibration plane determined is a reference plane.

11. A calibration standard for a lead scanner according to claim 1, wherein said calibration plane determined is a seating plane.

12. A calibration standard for a lead scanner according to claim 1, wherein said multiplicity of leads are bent downwardly for improving the rigidity of said leads.

13. A method for calibrating a lead scanner for measuring lead configurations in an IC package comprising the steps of:

provide a calibration standard having a multiplicity of leads extending outwardly from said standard wherein one lead each from three sides of said standard being made longer by at least 0.01 mm than the remaining multiplicity of leads, measuring a reference plane on said three longer leads and obtaining a first set of data, comparing said first set of data with an international measurement standard (NIST), adjusting the lead scanner and measuring a second set of data of said reference plane, and repeating said adjusting step and said measuring step until a final set of data which is substantially similar to said international measurement standard is obtained.

14. A method for calibrating a lead scanner according to claim 13, wherein said lead scanner is a CCD or laser lead scanner.

15. A method for calibrating a lead scanner according to claim 13, wherein said lead scanner is a CCD lead scanner.

16. A method for calibrating a lead scanner according to claim 13 further comprising the steps of measuring the co-planarity and the pitch of each of said multiplicity of leads.

17. A method for calibrating a lead scanner according to claim 13, wherein said one lead each from three sides of the standard is made longer preferably by 0.05 mm than the remaining multiplicity of leads.

18. A method for calibrating a lead scanner according to claim 13, wherein said multiplicity of leads are made of a thickness of not less than 0.5 mm.

19. A method for calibrating a lead scanner according to claim 13, wherein said multiplicity of leads are made preferably of a thickness of not less than 0.8 mm.

20. A method for calibrating a lead scanner according to claim 13, wherein said IC package is a plastic quad flat package.

* * * * *